(12) United States Patent
Tamura

(10) Patent No.: US 10,147,708 B2
(45) Date of Patent: Dec. 4, 2018

(54) LIGHT EMITTING DEVICE HAVING LIGHT EMITTING ELEMENTS OF SUBSTANTIALLY REGULAR HEXAGONAL SHAPE

(71) Applicant: NICHIA CORPORATION, Anan-shi (JP)

(72) Inventor: Kazuya Tamura, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/287,757

(22) Filed: Oct. 7, 2016

(65) Prior Publication Data
US 2017/0103971 A1 Apr. 13, 2017

(30) Foreign Application Priority Data
Oct. 8, 2015 (JP) .................. 2015-199891

(51) Int. Cl.
| H01L 27/07 | (2006.01) |
| H01L 25/075 | (2006.01) |
| F21V 7/00 | (2006.01) |
| H01L 33/38 | (2010.01) |

(52) U.S. Cl.
CPC ............ *H01L 25/0753* (2013.01); *F21V 7/00* (2013.01); *H01L 33/38* (2013.01)

(58) Field of Classification Search
CPC ......... H01L 25/0753; H01L 33/38; F21V 7/00
USPC ....................................................... 362/235
See application file for complete search history.

(56) References Cited

U.S. PATENT DOCUMENTS

| 2005/0211995 A1* | 9/2005 | Ou .................. H01L 33/22 257/80 |
| 2008/0087907 A1* | 4/2008 | Park .................. H01L 33/56 257/98 |
| 2009/0008654 A1 | 1/2009 | Nagai |
| 2012/0080713 A1 | 4/2012 | Agatani et al. |

(Continued)

FOREIGN PATENT DOCUMENTS

| JP | 2008-524831 | 7/2008 |
| JP | 2012-079855 | 4/2012 |

(Continued)

*Primary Examiner* — Anh Mai
*Assistant Examiner* — Hana Featherly
(74) *Attorney, Agent, or Firm* — Mori & Ward, LLP

(57) ABSTRACT

A light emitting device includes a package including a recess which includes a bottom surface having a substantially circular shape with a circular center, and light emitting elements provided on the bottom surface. Each of the light emitting elements has a substantially regular hexagonal shape. The light emitting elements include a first light emitting element, second light emitting elements provided to surround the first light emitting element, and a light reflective resin disposed between the first light emitting element and the second light emitting elements. The first light emitting element has an element center of the substantially regular hexagonal shape and is disposed on the bottom surface so that the element center substantially coincides with the circular center. Each side of the substantially regular hexagonal shape of the first light emitting element opposes one side of each of the substantially regular hexagonal shapes of the second light emitting elements.

18 Claims, 5 Drawing Sheets

(56) References Cited

U.S. PATENT DOCUMENTS

2012/0140506 A1* 6/2012 Waragawa .......... H01L 25/0753
362/516
2013/0126900 A1 5/2013 Inoue et al.
2014/0306230 A1* 10/2014 Chen ....................... H01L 33/20
257/76
2015/0049502 A1 2/2015 Brandl et al.

FOREIGN PATENT DOCUMENTS

JP 2015-512559 4/2015
WO WO 2012/020559 2/2012

* cited by examiner

LIGHT EMITTING DEVICE HAVING LIGHT EMITTING ELEMENTS OF SUBSTANTIALLY REGULAR HEXAGONAL SHAPE

CROSS-REFERENCE TO RELATED APPLICATIONS

The present application claims priority under 35 U.S.C. § 119 to Japanese Patent Application No. 2015-199891, filed Oct. 8, 2015. The contents of this application are incorporated herein by reference in their entirety.

BACKGROUND OF THE INVENTION

Field of the Invention

The present invention relates to a light emitting device.

Discussion of the Background

A light emitting device such as a light emitting diode (LED) has been known, which includes a semiconductor light emitting element. In particular, a light emitting device has been known, which includes a plurality of light emitting elements.

For example, a light emitting device has been known, in which a plurality of light emitting elements are disposed in a circular frame (see, for example, Japanese Unexamined Patent Application Publication No. 2012-079855, Japanese Translation of PCT International Application Publication No. 2008-524831).

SUMMARY OF THE INVENTION

According to one aspect of the disclosure, a light emitting device includes a package, light emitting elements, and a light reflective resin. The package includes a recess which includes a bottom surface having a substantially circular shape with a circular center. The light emitting elements are provided on the bottom surface. Each of the light emitting elements has a substantially regular hexagonal shape. The light emitting elements include a first light emitting element and second light emitting elements. The first light emitting element has an element center of the substantially regular hexagonal shape and is disposed on the bottom surface so that the element center substantially coincides with the circular center. The second light emitting elements are provided to surround the first light emitting element. Each side of the substantially regular hexagonal shape of the first light emitting element opposes one side of each of the substantially regular hexagonal shapes of the second light emitting elements. The light reflective resin is disposed between the first light emitting element and the second light emitting elements.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
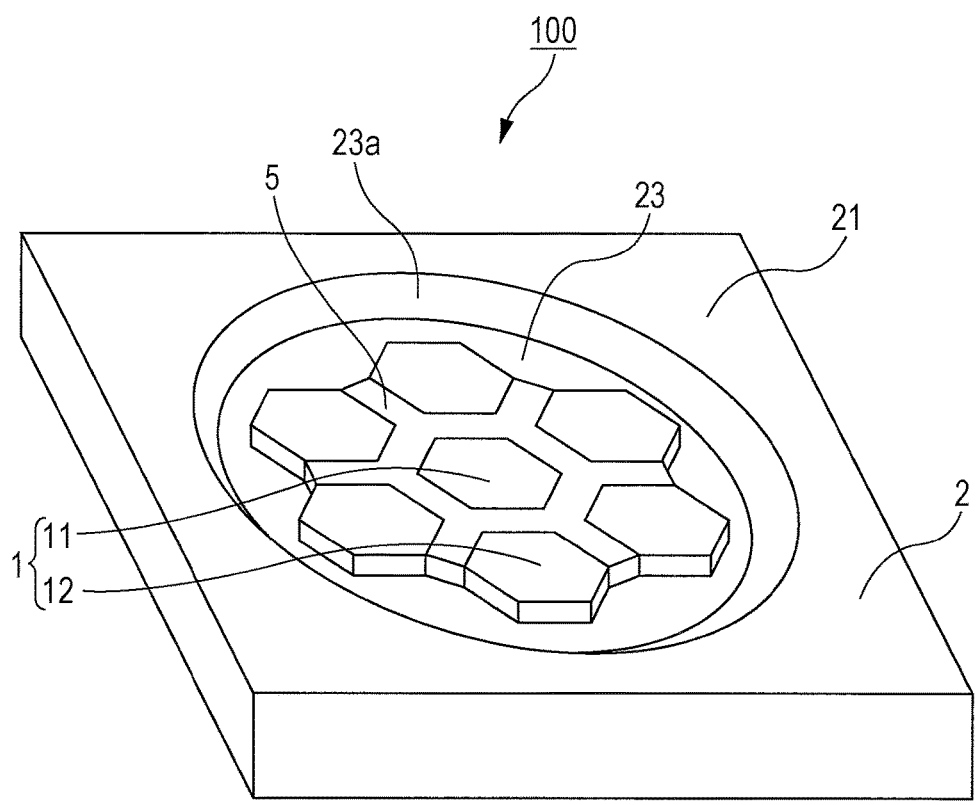
FIG. 1 is a schematic perspective view of a light emitting device according to a first embodiment.

The embodiments will now be described with reference to the accompanying drawings, wherein like reference numerals designate corresponding or identical elements throughout the various drawings.

A description will be given of a light emitting device according to an exemplary embodiment.

The drawings for reference in the following description schematically illustrate exemplary embodiments. Therefore, the respective drawings may illustrate scales of components, a length between components, and positional relations among components in an exaggerated manner or may partially omit the illustrations of the components. For example, scales of components and a length between components in a plan view may be different from those in a sectional view of the plan view. In the following description, the same designation and reference sign indicate identical or equivalent components in principle; therefore, the detailed description of such components will not be given as appropriate.

With regard to a light emitting device according to an exemplary embodiment and a method for manufacturing the light emitting device, the "upper", "lower", "left", and "right" sides may be changed depending on situations. In this description, the "upper" and "lower" sides merely indicate relative positions of constituent components in the respective drawings for reference, and therefore do not intend to indicate absolute positions of the constituent components unless otherwise specified.

First Embodiment

Figure 2A:
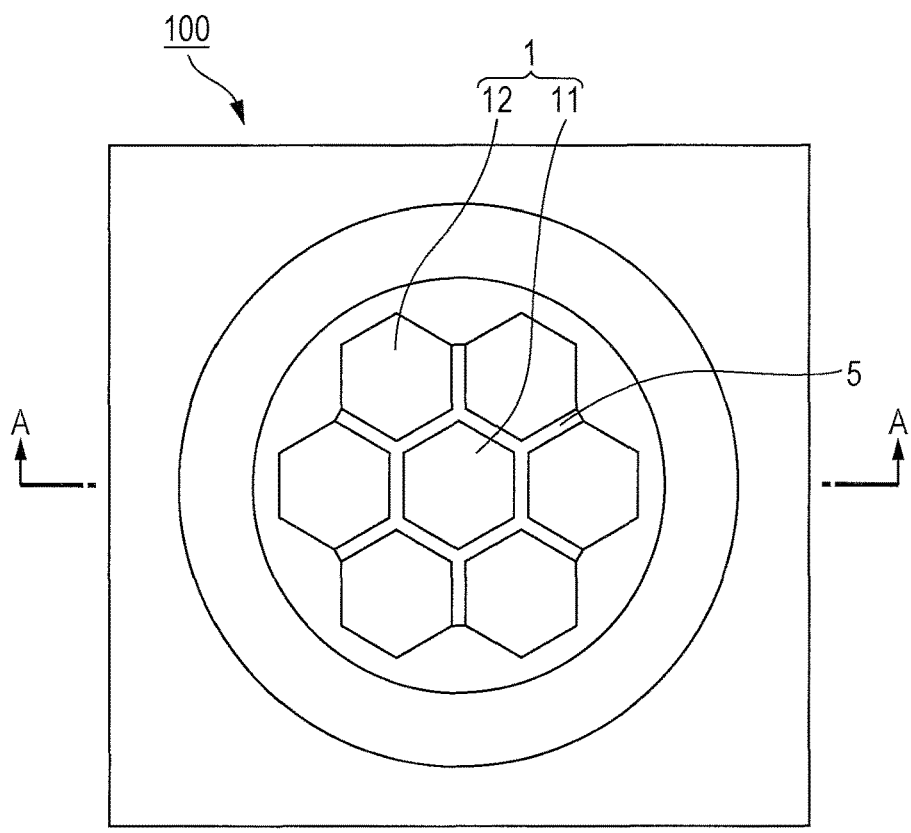
FIG. 2A is a schematic plan view of the light emitting device according to the first embodiment.
Figure 2B:
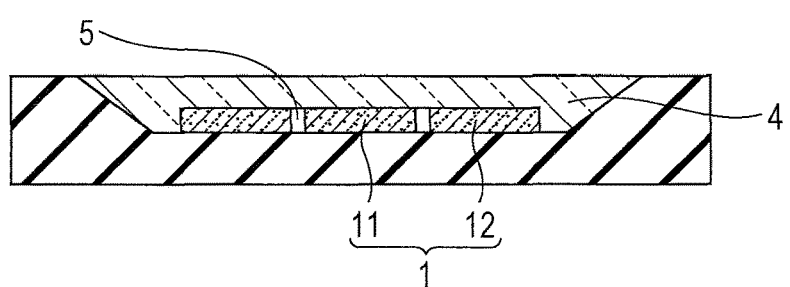
FIG. 2B is a schematic sectional view taken along line A-A in FIG. 2A.
Figure 2C:
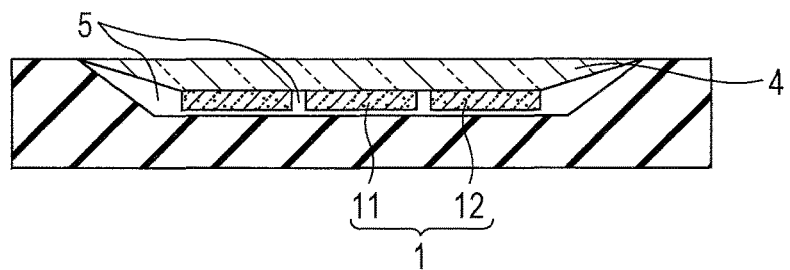
FIG. 2C is a schematic sectional view of a modification of the configuration illustrated in FIG. 2B.
Figure 3A:
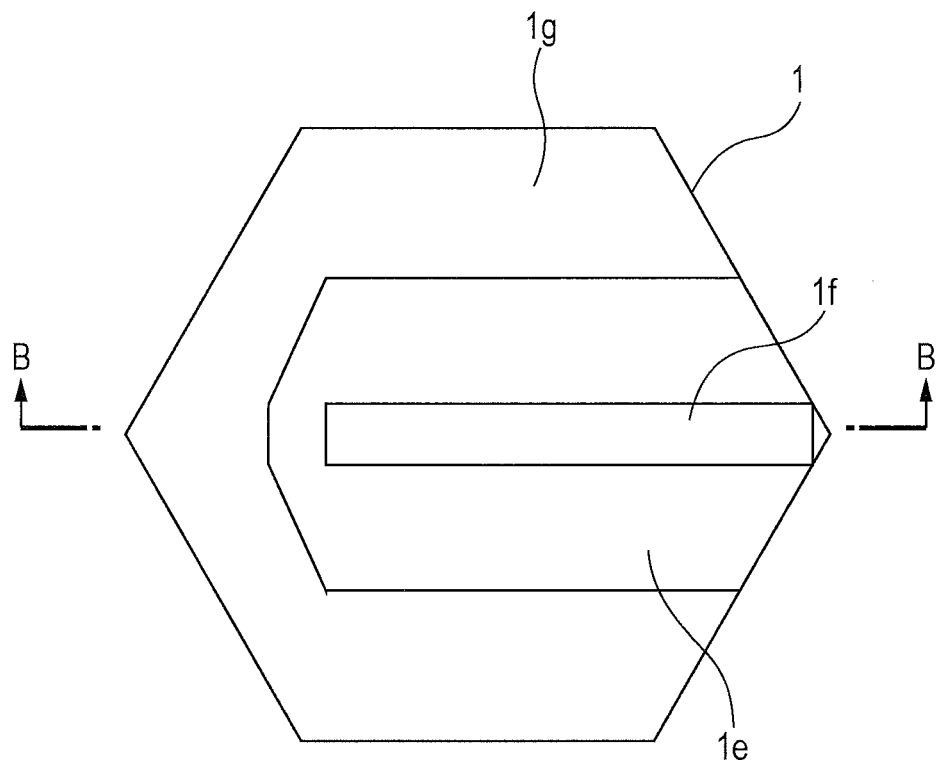
FIG. 3A is a schematic plan view of a light emitting element according to the first embodiment.
Figure 3B:
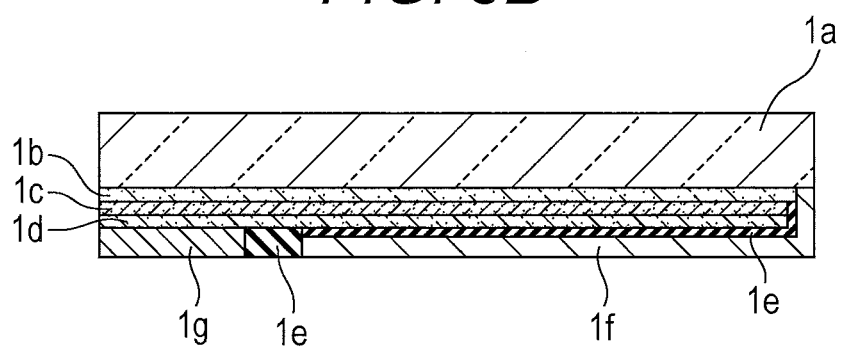
FIG. 3B is a schematic sectional view taken along line B-B in FIG. 3A.
Figure 4:
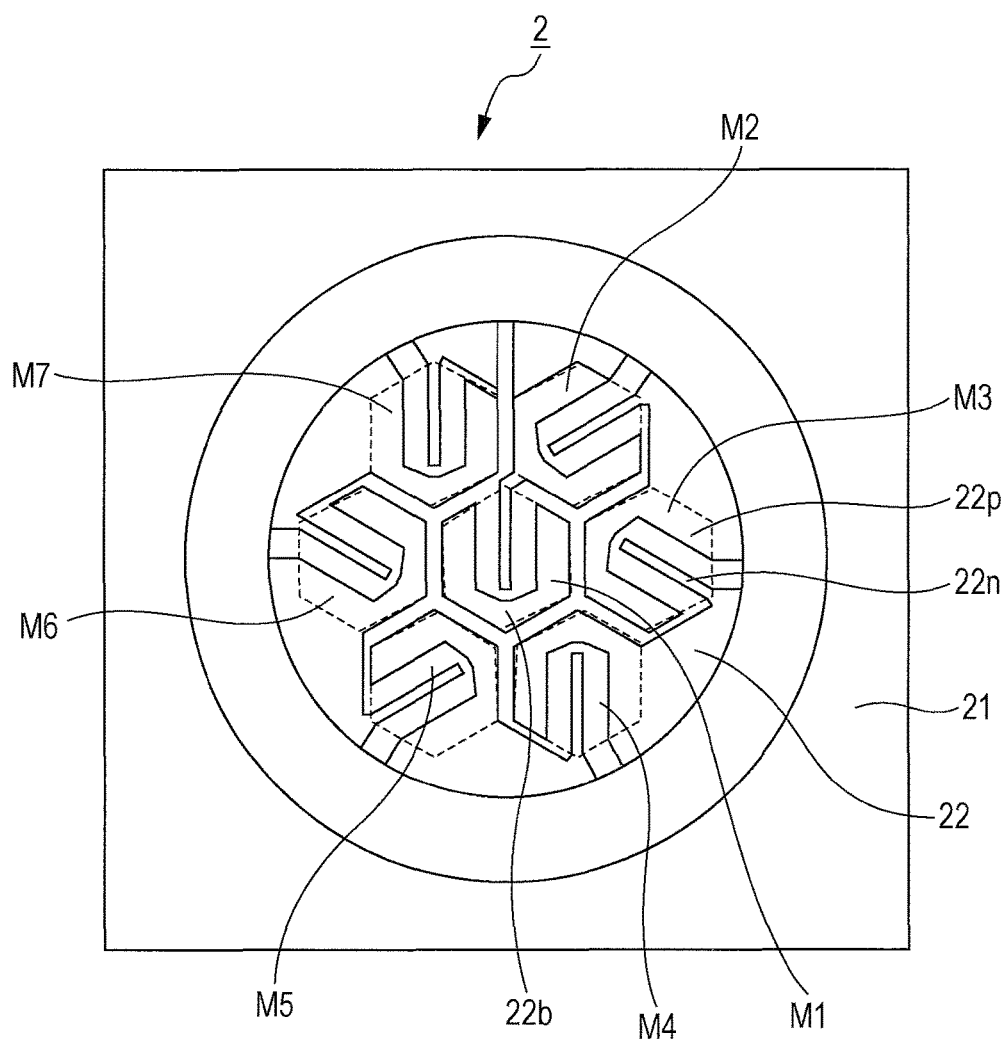
FIG. 4 is a schematic plan view of a package according to the first embodiment.

With reference to the drawings, a description will be given of a configuration of a light emitting device according to a first embodiment. FIG. 1 is a schematic perspective view of the light emitting device 100 according to the first embodiment. FIG. 2A is a schematic plan view of the light emitting device 100 illustrated in FIG. 1. FIG. 2B is a schematic sectional view taken along line A-A in FIG. 2A. FIG. 2C is a schematic sectional view of a modification of the configuration illustrated in FIG. 2B. FIG. 3A is a schematic plan view of a light emitting element mounted in a package of the light emitting device 100. FIG. 3B is a schematic sectional view taken along line B-B in FIG. 3A. FIG. 4 is a schematic plan view of the package 2 in the light emitting device 100.

The light emitting device 100 according to the first embodiment includes the package 2 having a recess 23 of circular shape as seen in a plan view, and at least seven light emitting elements 1 of regular hexagonal shape as seen in a plan view. The light emitting elements 1 include a first light emitting element 11 disposed at a center of a bottom surface of the recess 23, and six second light emitting elements 12 individually opposing the six sides of the first light emitting element 11. The light emitting device 100 also includes a light reflective resin 5 disposed between the first light emitting element 11 and each of the second light emitting elements 12.

The first light emitting element 11 and the second light emitting elements 12 are flip-chip mounted on the bottom surface of the recess 23 on the package 2. Specifically, each of the light emitting elements 1 has electrodes electrically coupled, with a conductive bonding member, to a conductive member 22 that forms a part of the bottom surface of the recess 23 and functions as a pair of positive and negative electrodes. The light emitting device 100 also includes a light transmissive sealing resin 4 with which the light emitting elements 1 in the recess 23 are sealed. The first light emitting element 11 and the second light emitting elements 12 each emit light from their upper surfaces upward from the opening of the recess 23 through the sealing resin 4.

The light emitting elements 1 of hexagonal shape as seen in a plan view are disposed on the circular recess 23, which leads to an increase in area of the light emitting elements 1 occupying a mount area (i.e., the bottom surface of the recess 23) on the package 2. Therefore, the use of the light emitting elements of hexagonal shape as seen in a plan view leads to improvement in output power from the light emitting device 100 as compared with use of light emitting elements of square shape as seen in a plan view if packages 2 to be used are equal in dimensions and recess size to each other.

Moreover, the light emitting elements 1 are disposed such that the side surfaces thereof oppose each other. The side surfaces of the opposing light emitting elements 1 are covered with the light reflective resin 5 (i.e., a clearance between the opposing light emitting elements 1 is filled with the light reflective resin 5), which leads to a reduction in interference of outgoing light. This configuration achieves efficient light extraction from the upper surfaces of the light emitting elements 1.

The first embodiment adopts seven light emitting elements of regular hexagonal shape as seen in a plan view. One of the light emitting elements (i.e., the first light emitting element 11) is disposed at the center of the recess 23, and the other six light emitting elements (i.e., the second light emitting elements 12) are disposed around the central light emitting element such that the centers thereof form the six vertexes of a regular hexagon. This layout reduces a length from the side surface of each light emitting element to the sidewall of the circular recess 23 as compared with the layout of square light emitting elements. This configuration achieves a reduction in color unevenness of light from the light emitting device 100.

The first light emitting element 11 and the second light emitting elements 12 are of regular hexagonal shape as seen in a plan view. The position of the first light emitting element 11 is different from the positions of the second light emitting elements 12 on the bottom surface of the recess 23 on the package 2. Specifically, the first light emitting element 11 is disposed such that the center thereof is on the center of the bottom surface of the recess 23. On the other hand, the second light emitting elements 12 are disposed around the first light emitting element 11. The first light emitting element 11 and the second light emitting elements 12 are preferably disposed such that the opposite sides thereof extend substantially in parallel. This configuration achieves a further reduction in color unevenness. Moreover, lengths from the sides of the first light emitting element 11 to the sides of the six second light emitting elements 12 each opposing the first light emitting element 11 are preferably substantially equal to one another. This layout achieves a light emitting part with less color unevenness in all directions about the first light emitting element 11. It should be noted that the phrase "the side surfaces of the light emitting elements extend in parallel" involves a case in which the side surfaces of the light emitting elements extend at an inclination within 10°.

Both the length from the first light emitting element 11 to each of the second light emitting elements 12 and the length between the adjacent second light emitting elements 12 may be 5 µm to 300 µm as seen in a plan view.

The first light emitting element 11 and each of the second light emitting elements 12 are substantially equal to each other in shape and size as seen in a plan view. The first light emitting element 11 and each of the second light emitting elements 12 may also substantially be equal in composition and hue to each other. However, the first light emitting element 11 and each of the second light emitting elements 12 may be different in composition and hue from each other. It should be noted that the first light emitting element 11 and the second light emitting elements 12 are collectively described as the "light emitting element" in some cases unless otherwise specified.

Disposing seven light emitting elements at the above-described positions in one recess 23 with good positional accuracy leads to a reduction in color unevenness. In order to dispose the light emitting elements with good positional accuracy, preferably, the shape of an electrode of each light emitting element is combined with the shape of a wire of the package, as a specific shape.

For example, each of the light emitting elements may include a negative electrode of shape extending along a line between the center of the hexagon and one of the corners of the hexagon. Alternatively, each of the light emitting elements may include a negative electrode of shape extending along a line between the center of the hexagon and the center of one of the sides of the hexagon. Each of the light emitting elements also includes a positive electrode that is spaced apart from the negative electrode and is provided to be in contact with a semiconductor layer with a larger contact area than a contact area of the negative electrode with the semiconductor layer. As illustrated in FIGS. 3A and 3B, for example, each of the light emitting elements may include a negative electrode 1f extending along a line between the center of the hexagon and one of the corners of the hexagon, and a positive electrode 1g disposed to spread over the remaining five corners of the hexagon and to surround the negative electrode 1f. The negative electrode 1f is of linear shape with substantially uniform width. Such a linear part disposed at the center of each light emitting element facilitates self-alignment in mounting the light emitting elements.

The first embodiment adopts a light emitting element including a positive electrode and a negative electrode formed on the same surface. In the light emitting element, the negative electrode is formed on a region where a negative layer is exposed by removal of a positive layer and a light emitting layer. In other words, this region does not emit light since the light emitting layer is removed from the semiconductor layer immediately below the negative electrode. In a light emitting element that includes a negative electrode extending to one of the corners or (the centers of) the sides of the hexagon as described above, the corner where the negative electrode is formed is lower in brightness than the other five corners. If light emitting elements having the above configuration are disposed in proximity to one another, occasionally, corners where negative electrodes are formed adjoin together, which may result in brightness unevenness. Hence, the negative electrodes are dispersed to avoid an arrangement of the dark regions in a cluster, which leads to a further reduction in brightness unevenness.

FIG. 3A is a schematic plan view of each light emitting element 1. FIG. 3B is a schematic sectional view taken along line B-B in FIG. 3A. Each light emitting element 1 includes a light transmissive substrate 1a. Each light emitting element 1 also includes a negative layer 1b, a light emitting layer 1c, and a positive layer 1d each disposed below the light transmissive substrate 1a. Each light emitting element 1 also includes a negative electrode if disposed on the negative layer 1b, and a positive electrode 1g disposed on the positive layer 1d. The negative electrode 1f is disposed on the negative layer 1b exposed by removal of a part of the positive layer 1d and a part of the light emitting layer 1c. In other words, the positive electrode 1g and the negative electrode 1f are disposed on the same surface.

Each light emitting element 1 also includes an insulating film 1e disposed to cover a part of the negative electrode 1f on the positive electrode 1g in order to extend an exposure area of the negative electrode 1f (i.e., an area of a portion to be bonded to the wire of the package at the time of mounting). Each light emitting element 1 may have a structure in that the negative electrode 1f is disposed above the positive electrode 1g with the insulating film 1e interposed between the negative electrode 1f and the positive electrode 1g. Each light emitting element 1 may also have a structure in that an insulating layer is interposed between the negative electrode 1f and the positive electrode 1g to prevent occurrence of a short circuit.

FIG. 4 illustrates an exemplary package where light emitting elements each having the electrodes of the shapes illustrated in FIG. 3A are disposed. The conductive member 22 (including a positive conductive member 22p and a negative conductive member 22n) is disposed on the bottom surface of the recess 23 on the package 2. In FIG. 4, (hexagonal) broken lines each indicate a position where a light emitting element is mounted. A region surrounded with each broken line is referred to as a "mount part". For example, a region where a first light emitting element is disposed, that is, a pair of conductive members disposed at the center of the recess 23 is referred to as a first mount part M1. In other words, a positive conductive member and a negative conductive member on a region enclosed with a broken line are collectively referred to as a mount part. Likewise, regions where six second light emitting elements are disposed individually are referred to as a second mount part M2, a third mount part M3, a fourth mount part M4, a fifth mount part M5, a sixth mount part M6, and a seventh mount part M7, respectively.

In the first mount part M1, the negative conductive member 22n is of linear shape passing through the center of the first mount part M1 and extending linearly to the uppermost corner of the hexagon. On the other hand, the positive conductive member 22p is of continuous shape spreading over the other five corners of the first mount part M1. More specifically, the positive conductive member 22p has such a shape that the negative conductive member 22n is surrounded with the positive conductive member 22p except for the upper side of the negative conductive member 22n.

The second to seventh mount parts M2 to M7 are arranged in the clockwise direction, starting from the second mount part M2 on the upper right side of the first mount part M1. The negative conductive member 22n on the second mount part M2 passes through the center of the second mount part M2 and extends to the upper right corner of the second mount part M2. The negative conductive member 22n on the third mount part M3 passes through the center of the third mount part M3 and extends to the lower right corner of the third mount part M3. The negative conductive member 22n on the fourth mount part M4 passes through the center of the fourth mount part M4 and extends to the lowermost corner of the fourth mount part M4. The negative conductive member 22n on the fifth mount part M5 passes through the center of the fifth mount part M5 and extends to the lower left corner of the fifth mount part M5. The negative conductive member 22n on the sixth mount part M6 passes through the center of the sixth mount part M6 and extends to the upper left corner of the sixth mount part M6. The negative conductive member 22n on the seventh mount part M7 passes through the center of the seventh mount part M7 and extends to the uppermost corner of the seventh mount part M7.

With regard to the second to seventh mount parts M2 to M7 where the six second light emitting elements 12 are mounted individually, the corners where the negative conductive members 22n are disposed individually are spaced apart from one another so as to be separate from the first mount part M1 where the first light emitting element 11 is mounted. Moreover, the second to seventh mount parts M2 to M7 are spaced apart from one another such that the negative conductive members 22n on the adjacent mount parts are separate from each other. Specifically, the negative conductive members 22n on the second to seventh mount parts M2 to M7 each oppose an inner surface 23a of the recess 23 on the package 2.

The corners where the negative electrodes are disposed individually are separated from one another as described above, which leads to a reduction in brightness unevenness.

As illustrated in FIG. 4, the first to seventh mount parts M1 to M7 are arranged in series. More specifically, the negative conductive member 22n on the first mount part M1 is contiguous to the positive conductive member 22p on the second mount part M2. The negative conductive member 22n on the second mount part M2 is contiguous to the positive conductive member 22p on the third mount part M3. The negative conductive member 22n on the third mount part M3 is contiguous to the positive conductive member 22p on the fourth mount part M4. The negative conductive member 22n on the fourth mount part M4 is contiguous to the positive conductive member 22p on the fifth mount part M5. The negative conductive member 22n on the fifth mount part M5 is contiguous to the positive conductive member 22p on the sixth mount part M6. The negative conductive member 22n on the sixth mount part M6 is contiguous to the positive conductive member 22p on the seventh mount part M7. Each of the positive conductive member 22p on the first mount part M1 and the negative conductive member 22n on the seventh mount part M7 has a via hole 22b, and is contiguous to the conductive member 22 on the lower surface of the package 2 through the via hole 22b.

Next, a description will be given of the amount or position of the light reflective resin 5. The light reflective resin 5 is preferably applied to cover at least the light emitting layer 1c at a side surface of each light emitting element 1. The light reflective resin 5 is also preferably applied not to cover an upper surface of the light transmissive substrate 1a corresponding to a light emitting surface of each light emitting element 1. In other words, the light reflective resin 5 may be applied to cover a side surface of the light transmissive substrate 1a. Examples of a method of applying the light reflective resin 5 may include, but not limited to, a method of applying a light reflective resin, using capillary action.

The light reflective resin 5 is also preferably applied between the adjacent second light emitting elements 12. This configuration reduces the absorption of light at a clearance between the adjacent second light emitting elements 12 and also reduces a decrease in light extraction efficiency.

As illustrated in FIG. 2C, furthermore, the light reflective resin 5 may be applied onto an outer periphery of each second light emitting element 12, that is, may be applied between the side surface 23a of the recess 23 and each second light emitting element 12. In this case, the light reflective resin 5 is preferably applied to cover the light emitting layer 1c of each second light emitting element 12 at a side surface of each second light emitting element 12 opposing the side surface 23a of the recess 23 and to cover the side surface 23a of the recess 23 up to the upper end of the side surface 23a of the recess 23. In this case, the light reflective resin 5 has an inclined upper surface as illustrated in FIG. 2C.

Alternatively, the light reflective resin 5 may be applied below the first light emitting element 11 and the second light emitting elements 12. Specifically, a clearance by the height of the positive electrode and negative electrode of each light emitting element (i.e., a space between the lower surface of each light emitting element and the upper surface of the package) is created below each light emitting element. In filling the clearance with the light reflective resin 5, the light reflective resin to be applied between the first light emitting element 11 and each second light emitting element 12 and the light reflective resin to be applied below each light emitting element may be applied integrally or independently. In particular, the light reflective resin to be applied below each light emitting element is preferably smaller in coefficient of thermal expansion than the light reflective resin to be applied to cover the light emitting layer. This configuration reduces occurrence of such a situation that the light reflective resin below each light emitting element expands by heat to lift each light emitting element, thereby separating the electrodes of each light emitting element from the conductive member 22. In this case, a resin with low thermal expansion and contraction is preferably applied in advance onto a terminal non-contact portion between the electrodes below each light emitting element 1.

Second Embodiment

Figure 5:
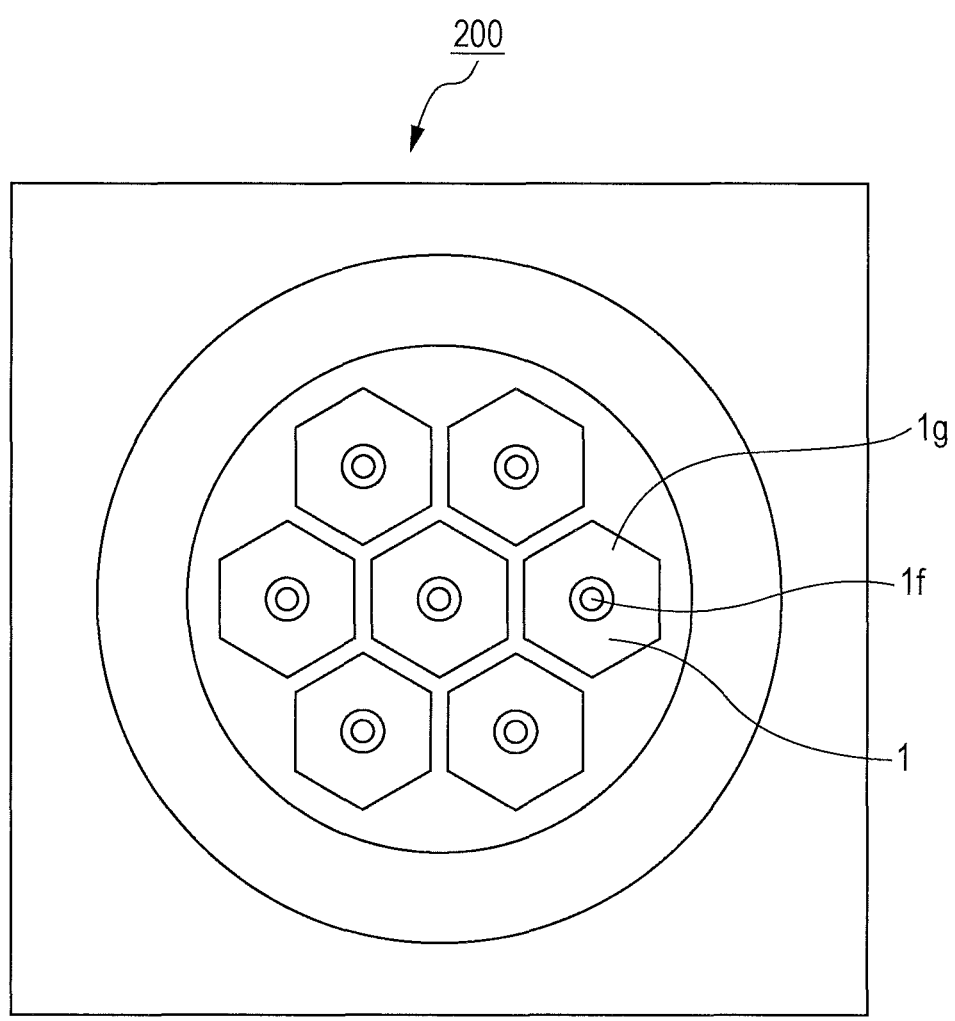
FIG. 5 is a schematic plan view of a light emitting device according to a second embodiment.

FIG. 5 is a schematic plan view of a light emitting device 200 according to a second embodiment. In the second embodiment, light emitting elements 1 of hexagonal shape each include a circular negative electrode 1f disposed at a center of each light emitting element 1, and a positive electrode 1g disposed to surround the negative electrode 1f and having a hexagonal contour. The use of rotationally symmetric electrode shape allows the orientations of the light emitting elements 1 to be optionally selected in mounting the light emitting elements 1. In a situation in which the light emitting elements 1 are arranged in correct orientations by self-alignment, if the light emitting elements 1 are misaligned in a rotational direction, then the light emitting elements 1 can be arranged in the correct orientations even when being rotated in either the clockwise direction or the counterclockwise direction.

Next, detailed descriptions will be given of the constituent components in the foregoing embodiments.

Package

The package 2 includes the conductive member 22 for feeding electric power to a light emitting element, and a base 21 having an insulating property. The package 2 has the recess 23 where a light emitting element is mounted, and the conductive member 22 is disposed on the bottom surface of the recess 23. The recess 23 is of circular shape as seen in a plan view, and light is emitted from the circular opening of the recess 23.

The recess 23 has the inner surface 23a which is perpendicular to or inclined relative to the bottom surface of the recess 23. The inner surface 23a of the recess 23 is preferably inclined upward such that light from a light emitting element is reflected upward, that is, reflected in a light extracting direction.

The base 21 is preferably formed of a member configured to reflect light emitted from a light emitting element. The base 21 is preferably mainly constituted of, for example, resin or ceramic. A light reflective resin can be obtained by addition of light reflective particles to the resin or ceramic for the base 21. A resin material for the base 21 may be thermosetting resin or thermoplastic resin. Examples of the thermosetting resin may include, but not limited to, silicone resin, silicone-modified resin, silicone hybrid resin, epoxy resin, epoxy-modified resin, urea resin, diallylphthalate resin, phenolic resin, unsaturated polyester resin, and hybrid resin containing one or more kinds of the above resins. Examples of the thermoplastic resin may include, but not limited to, polycarbonate resin, acrylic resin, polymethylpentene resin, polynorbornene resin, polyphthalamide resin, polyester resin, liquid crystal resin, polyphenyleneether resin, aromatic polyamide resin, and hybrid resin containing one or more kinds of the above resins. In particular, preferably used are polyester resin such as PCT (polycyclohexylenedimethylene terephthalate) which is excellent in heat resistance and light resistance, aromatic polyamide resin, epoxy resin, unsaturated polyester resin, silicone resin, and silicone hybrid resin.

Preferable examples of the ceramic material for the base 21 may include, but not limited to, aluminum nitride and aluminum oxide.

The light reflective member to be contained in the base 21 may preferably takes the form of particles of a material which has a large difference in refractive index from the above resin material and also has a favorable light reflecting property. The light reflective member has a refractive index which is, for example, equal to or higher than 1.8. The refractive index is preferably equal to or higher than 2.0, more preferably equal to or higher than 2.5, in order to scatter light efficiently and attain high light extraction efficiency. The difference in refractive index between the light reflective member and the resin material is, for example, equal to or larger than 0.4. The difference in refractive index is preferably equal to or larger than 0.7, more preferably equal to or larger than 0.9, in order to scatter light efficiently and attain high light extraction efficiency. The particles of the light reflective member have a mean diameter of preferably 0.08 μm to 10 μm (inclusive), more preferably 0.1 μm to 5 μm (inclusive), in order to produce an effect of scattering light at high efficiency.

Specific examples of the light reflective member to be contained in the base 21 may include, but not limited to, particles of white pigments such as $TiO_2$ (titanium oxide), $ZrO_2$ (zirconium oxide), MgO (magnesium oxide), $MgCO_3$ (magnesium carbonate), $Mg(OH)_2$ (magnesium hydroxide), $CaCO_3$ (calcium carbonate), $Ca(OH)_2$ (calcium hydroxide), $CaSiO_3$ (calcium silicate), ZnO (zinc oxide), $BaTiO_3$ (barium titanate), $Al_2O_3$ (aluminum oxide), BN (boron nitride), and diamond.

In this description, the value of a mean diameter of particles of, for example, a light reflective member and a wavelength conversion member is based on observation using an electron microscope. The particles are measured along a specific axial direction (i.e., Feret's diameter). Moreover, the mean diameter of the particles is obtained from particle size distributions measured based on the different sizes of particles using an electron microscope (e.g., a scanning electron microscope (SEM), a transmission electron microscope (TEM)).

The conductive member 22, on which light emitting elements are mounted, of the package 2 functions as a pair of positive and negative electrodes for feeding electric power to the light emitting elements. The conductive member 22 is disposed on the bottom surface of the recess 23 to connect the light emitting elements in series or in parallel. The conductive member 22 also functions as an external terminal that is exposed to the outside of the light emitting device on a lower surface side or upper surface side of the light emitting device and is connected to an external power supply.

If the conductive member 22 serving as the external terminal is on the upper surface side of the light emitting device, the conductive member 22 can be disposed more outward than the sidewall of the recess 23. On the other hand, if the conductive member 22 serving as the external terminal is on the lower surface side of the light emitting device, the conductive member 22 may be configured to connect the bottom surface of the recess 23 to the lower surface of each light emitting element with the conductive member on the side surface of each light emitting element. Alternatively, the conductive member 22 may include internal wires, such as an interlayer wire and a via hole, to be disposed inside the base 21 to connect the bottom surface of the recess 23 to the lower surface of the light emitting device.

The conductive member 22 may have uniform thickness or partly irregular thickness. Although the material for the conductive member 22 is not particularly limited, the conductive member 22 is preferably formed of a material with relatively large heat conductivity. The conductive member 22 formed of such a material may efficiently release heat generated at the light emitting elements, to the outside. The material for the conductive member 22 preferably has heat conductivity which is, for example, equal to or more than about 200 W/(m·K) and relatively large mechanical strength. Specific examples of the material for the conductive member 22 may include, but not limited to, metals such as copper, aluminum, gold, silver, tungsten, iron, and nickel, and alloys such as an iron-nickel alloy and phosphor bronze. In addition, a radiating member may be disposed on the lower surface of the light emitting device, that is, around the contact surface of the light emitting elements with the conductive member 22. The radiating member is preferably an insulator with high heat conductivity and high refractive index. Specific examples of the radiating member may include, but not limited to, titanium oxide, alumina, boron nitride, and diamond.

Light Reflective Resin

The light reflective resin 5 is constituted of a resin material and a reflective material. For example, a content of the reflective material in the resin material is preferably about 20 wt % to about 60 wt %. The content of more than 60 wt % results in an increase in viscosity of the light reflective resin 5, which may cause a decrease in handleability of the light reflective resin 5. However, the content is not limited to this range in some cases, depending on the viscosity, thixotrophy, and the like of the resin material as well as the specific surface area, particle diameter, and the like of the reflective material.

Preferable examples of the resin material may include, but not limited to, silicone resin.

The reflective material is preferably an insulator with high heat conductivity and high refractive index. Specific examples of the reflective material may include, but not limited to, particles of white pigments such as $TiO_2$ (titanium oxide), $ZrO_2$ (zirconium oxide), MgO (magnesium oxide), $MgCO_3$ (magnesium carbonate), $Mg(OH)_2$ (magnesium hydroxide), $CaCO_3$ (calcium carbonate), $Ca(OH)_2$ (calcium hydroxide), $CaSiO_3$ (calcium silicate), ZnO (zinc oxide), $BaTiO_3$ (barium titanate), $Al_2O_3$ (aluminum oxide), BN (boron nitride), and diamond. In particular, the reflective material is preferably $TiO_2$ since $TiO_2$ becomes relatively stable to, for example, moisture, has a high refractive index, and is excellent in heat conductivity. In order to attain more favorable reflectivity, the reflective material is preferably $TiO_2$ if the light emitting elements 1 are configured to emit visible light. On the other hand, the reflective material is preferably $Al_2O_3$ if the light emitting elements 1 are configured to emit ultraviolet light.

Sealing Resin

The sealing resin 4 is mainly constituted of a light transmissive resin material. The sealing resin 4 is disposed such that the recess 23 on the package 2 is filled with the sealing resin 4, and is configured to seal a light emitting element to be mounted on the conductive member 22 disposed on the bottom surface of the recess 23. The sealing resin 4 may contain a wavelength conversion member (phosphor) that converts the light emitted from the light emitting elements 1 into light of different wavelengths. For example, when the light emitting elements 1 are configured to emit blue light and the wavelength conversion member is configured to convert part of the blue light into yellow light, the light emitting device can be configured to emit white light obtained by mixing the blue light with the yellow light. The sealing resin 4 may contain plural kinds of wavelength conversion members. Alternatively, the sealing resin 4 may contain either a light diffusing member or a member that increases viscosity or thixotrophy or may contain both the members, in place of or in addition to the wavelength conversion member.

The sealing resin 4 is preferably formed of a material that exhibits favorable light transmissivity to the wavelength of light from the light emitting elements 1 and the wavelength of light from the wavelength conversion member and also exhibits favorable weather resistance, light resistance, and heat resistance as a sealing member. Examples of the material may include, but not limited to, resin materials similar to those for the base 21, and glass. Examples of the resin material for the sealing resin 4 may include, but not limited to, silicone resin, silicone-modified resin, silicone hybrid resin, fluororesin, fluorine-modified resin, and adamantane resin. In particular, silicone resin and fluororesin are preferably used because of their excellent heat resistance and light resistance. Silicone resin having a refractive index of 1.4 to 1.6 is preferably used. In particular, silicone resin having a refractive index of 1.41 to 1.55 is more preferably used because of its excellent heat resistance, light resistance, light extraction property, gas barrier property, and sulfur resistance.

The wavelength conversion member (phosphor) used herein may be wavelength conversion members publicly known in the art. Examples of the wavelength conversion member may include, but not limited to, a cerium-activated YAG (Yttrium-Aluminum-Garnet) phosphor that emits green to yellow light, a cerium-activated LAG (Lutetium-Aluminum-Garnet) phosphor that emits green light, a europium and/or chromium-activated nitrogen-containing calcium aluminosilicate ($CaO$—$Al_2O_3$—$SiO_2$) phosphor that emits green to red light, a europium-activated silicate ($(Sr, Ba)_2SiO_4$) phosphor that emits blue to red light, a β-sialon phosphor that emits green light, a sulfur phosphor represented by $SrGa_2S_4$:Eu, a nitride phosphor that emits red light, such as a CASN phosphor represented by $CaAlSiN_3$:Eu or a SCASN phosphor represented by $(Sr,Ca)AlSiN_3$:Eu, a KSF ($K_2SiF_6$:Mn) phosphor that emits red light, a SLAN ($SrLiAl_3N_4$:Eu) phosphor that emits red light, and a green to red quantum dot. Examples of the material for the light diffusing member may include, but not limited to, materials similar to those for the light reflective member.

Specific examples of the light diffusing member to be contained in the sealing resin 4 may include, but not limited to, white particles of $SiO_2$, $TiO_2$, $ZrO_2$, $MgO$, $MgCO_3$, $Mg(OH)_2$, $CaCO_3$, $Ca(OH)_2$, $CaSiO_3$, $ZnO$, $BaTiO_3$, and $Al_2O_3$.

A mean diameter of the particles of the light diffusing member contained in the sealing resin 4 is preferably 0.001 µm to 10 µm (inclusive), which leads to highly efficient light scattering properties. In particular, the mean diameter of the particles of the light diffusing member in the sealing resin 4 is more preferably 0.001 µm to 0.05 µm. This produces a high light scattering effect, that is, the Rayleigh scattering effect or an effect of making a wavelength conversion member dispersed state uniform, which leads to further improvement in light extraction efficiency of the light emitting device.

Moreover, the particles of the light diffusing member, of which the mean diameter is preferably 0.001 µm to 0.05 µm, are combined with the wavelength conversion member described above, particularly, a nitride phosphor such as a CASN phosphor or a SCASN phosphor, a fluoride phosphor such as a KSF phosphor, or a sulfide phosphor. This combined use improves light extraction efficiency. If the wavelength conversion member can be dispersed uniformly and if the light extraction efficiency can be improved, the amount of wavelength conversion member to be used can be decreased, which reduces an increase in temperature due to the heat generated from the wavelength conversion member. This configuration reduces degradation of the wavelength conversion member and improves the reliability of the light emitting device.

In addition, a protective element may be provided in addition to the light emitting elements 1, in order to protect the light emitting elements 1 from electrostatic discharge. The protective element may be a Zener diode to be connected in parallel to the light emitting elements 1 so as to be opposite in polarity to the light emitting elements 1. The protective element may also be a varistor, a resistor, or a capacitor.

Conductive Bonding Member

The light emitting elements 1 are bonded to a conductive member of a package with a conductive bonding member. The conductive bonding member is preferably formed of a material to be melted by heat, for achievement of self-alignment. Examples of the material may include, but not limited to, Au, Ag, Cu, Al, and Sn.

Although light emitting devices according to the embodiments of the present invention have been described specifically by way of embodiments of the invention hereinabove, the gist of the invention is not limited to these descriptions and should be widely construed based on the description of the appended claims. It is needless to say that changes and modifications of the embodiments in various ways based on those descriptions are included in the gist of the invention.

The light emitting device according to the embodiments of the present disclosure can be used for various types of light sources such as a backlight source for a liquid crystal display, various types of lighting fixtures, a large display, various displays for advertising or destinations, a projector, and further an image reading apparatus such as a digital video camera, a facsimile, a copying machine, and a scanner.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a package including a recess which includes a bottom surface having a substantially circular shape with a circular center;
   light emitting elements which are provided on the bottom surface and each of which has a substantially regular hexagonal shape, each of the light emitting elements having an upper surface and a lower surface, the lower surfaces of the light emitting elements facing the bottom surface of the recess, each of the light emitting elements having side surfaces that extend from the upper surface to the lower surface, the light emitting elements comprising:
      a first light emitting element having an element center of the substantially regular hexagonal shape and disposed on the bottom surface so that the element center substantially coincides with the circular center; and
      second light emitting elements provided to surround the first light emitting element, each side of the substantially regular hexagonal shape of the first light emitting element opposing one side of each of the substantially regular hexagonal shapes of the second light emitting elements;
   a light reflective resin disposed between the first light emitting element and the second light emitting elements such that the upper surfaces of the light emitting elements are exposed from the light reflective resin; and
   a light transmissive resin covering at least one side surface of the side surfaces of each of the second light emitting elements, the light transmissive resin being in contact with the bottom surface.

2. The light emitting device according to claim 1, wherein a length from the first light emitting element to each of the second light emitting elements is 1 µm to 300 µm.

3. The light emitting device according to claim 1,
   wherein each of the first light emitting element and the second light emitting elements has a lower surface on which a positive electrode and a negative electrode are disposed, and
   wherein the positive electrode and the negative electrode are coupled to a conductive member of the package with a conductive bonding member.

4. The light emitting device according to claim 3, wherein the negative electrode extends through a center of the lower surface of each of the second light emitting elements.

5. The light emitting device according to claim 3, wherein the positive electrode and the negative electrode are individually disposed between opposite sides of the lower surface of each of the first and second light emitting elements.

6. The light emitting device according to claim 3, wherein the positive electrode and the negative electrode are individually disposed on opposite corners of the lower surface of each of the first and second light emitting elements.

7. The light emitting device according to claim 6, wherein the negative electrode extends along a line connecting the center of the lower surface and one of the corners of the lower surface of each of the light emitting elements.

8. The light emitting device according to claim 1, wherein the light emitting elements comprises seven light emitting elements.

9. The light emitting device according to claim 1, wherein the light reflective resin is disposed between the first light emitting element and the second light emitting elements and among the second light emitting elements.

10. The light emitting device according to claim 1,
wherein the upper surfaces of the light emitting elements each have a substantially regular hexagonal shape, and
wherein the lower surfaces of the light emitting elements each have a substantially regular hexagonal shape.

11. The light emitting device according to claim 10,
wherein each of the light emitting elements have six lateral surfaces that extend from the upper surface of a respective light emitting element to the lower surface of the respective light emitting element, and
wherein the light reflective resin is disposed between the lateral surfaces of the first light emitting element and adjacent lateral surfaces of the second light emitting elements.

12. The light emitting device according to claim 11, wherein each of the lateral surfaces of the first light emitting element is substantially parallel to and faces one of the adjacent lateral surfaces of each of the second light emitting elements.

13. The light emitting device according to claim 1,
wherein a content of the reflective material in the light reflective resin ranges from 20 wt % to 60 wt %.

14. The light emitting device according to claim 1, further comprising:
an additional light reflecting resin disposed between the bottom surface and the lower surfaces of the light emitting elements, a coefficient of thermal expansion of the additional light reflecting resin being smaller than a coefficient of thermal expansion of the light reflecting resin.

15. The light emitting device according to claim 1,
wherein the package includes a top surface surrounding the recess,
wherein the recess includes a peripheral surface connecting the bottom surface and the top surface,
wherein the light reflective resin has light reflective resin side surfaces exposed from the at least one of the side surfaces of the second light emitting elements, and
wherein a space between the peripheral surface of the recess and each of the at least one of the side surfaces of the second light emitting elements and the light reflective resin side surfaces is filled with the light transmissive resin.

16. The light emitting device according to claim 15,
wherein each of the second light emitting elements has six side surfaces connecting the upper surface and the lower surface,
wherein three side surfaces of each of the second light emitting elements are exposed from the light reflective resin.

17. The light emitting device according to claim 16,
wherein the package includes light reflective particles.

18. A light emitting device comprising:
a package including a recess which includes a bottom surface having a substantially circular shape with a circular center;
light emitting elements which are provided on the bottom surface and each of which has a substantially regular hexagonal shape, each of the light emitting elements having an upper surface and a lower surface, the lower surfaces of the light emitting elements facing the bottom surface of the recess, the light emitting elements comprising:
a first light emitting element having an element center of the substantially regular hexagonal shape and disposed on the bottom surface so that the element center substantially coincides with the circular center; and
second light emitting elements provided to surround the first light emitting element, each side of the substantially regular hexagonal shape of the first light emitting element opposing one side of each of the substantially regular hexagonal shapes of the second light emitting elements;
a light reflective resin disposed between the first light emitting element and the second light emitting elements such that the upper surfaces of the light emitting elements are exposed from the light reflective resin; and
an additional light reflecting resin disposed between the bottom surface and the lower surfaces of the light emitting elements, a coefficient of thermal expansion of the additional light reflecting resin being smaller than a coefficient of thermal expansion of the light reflecting resin.

* * * * *